United States Patent
Andrys et al.

(10) Patent No.: US 6,639,470 B1
(45) Date of Patent: Oct. 28, 2003

(54) CONSTANT CURRENT BIASING CIRCUIT FOR LINEAR POWER AMPLIFIERS

(75) Inventors: Paul Andrys, Swisher, IA (US); Mark Bloom, Newbury Park, CA (US); Hugh J. Finlay, Moorpark, CA (US); David Ripley, Cedar Rapids, IA (US); Terry Shie, Cedar Rapids, IA (US); Kevin Hoheisel, Hiawatha, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/693,398

(22) Filed: Oct. 21, 2000

(Under 37 CFR 1.47)

Related U.S. Application Data

(60) Provisional application No. 60/238,846, filed on Oct. 6, 2000.

(51) Int. Cl.[7] .............................. H03F 3/04; H03K 5/08
(52) U.S. Cl. ..................... 330/296; 330/285; 327/309
(58) Field of Search .................... 330/133, 134, 330/285, 296; 327/309, 312, 321

(56) References Cited

U.S. PATENT DOCUMENTS

| | | | | |
|---|---|---|---|---|
| 4,340,867 A | * | 7/1982 | Sano | 330/296 |
| 4,354,163 A | * | 10/1982 | Kato | 330/108 |
| 4,387,346 A | * | 6/1983 | Fackler | 330/296 |
| 4,816,963 A | * | 3/1989 | Eden | 330/298 |
| 4,935,705 A | * | 6/1990 | Estanislao et al. | 330/285 |
| 5,107,224 A | * | 4/1992 | Meyer | 330/261 |
| 5,216,383 A | * | 6/1993 | Uittenbogaard et al. | 330/279 |
| 5,535,968 A | * | 7/1996 | Mokkapati et al. | 330/306 |
| 5,654,672 A | * | 8/1997 | Bailey et al. | 330/296 |
| 5,760,651 A | * | 6/1998 | Wong | 330/296 |
| 6,046,642 A | * | 4/2000 | Brayton et al. | 330/296 |
| 6,052,032 A | * | 4/2000 | Jarvinen | 330/296 |
| 6,201,444 B1 | * | 3/2001 | Sevic et al. | 330/307 |
| 6,215,358 B1 | * | 4/2001 | Hon et al. | 330/296 |
| 6,252,458 B1 | * | 6/2001 | Shibata | 330/261 |

* cited by examiner

Primary Examiner—Robert Pascal
Assistant Examiner—Khanh Van Nguyen
(74) Attorney, Agent, or Firm—The Eclipse Group; Francisco A. Rubio-Campos

(57) ABSTRACT

A constant current bias approach that receives an input bias voltage and maintains a temperature independent constant current bias in a linear amplifier device. Integrated sense circuitry protects against unacceptable input voltages to guarantee bias stability. Fabrication in multiple semiconductor technologies and assembly into a single package allows for optimum cost and performance of DC bias and RF amplifier sections.

24 Claims, 3 Drawing Sheets

CONSTANT CURRENT BIASING CIRCUIT FOR LINEAR POWER AMPLIFIERS

CROSS REFERENCE To RELATED APPLICATION

This application claims the benefit of U.S. Provisional Application No. 60/238,846, entitled "CONFIGURABLE POWER AMPLIFIER BIAS CONTROL," filed Oct. 6, 2000, that is incorporated by reference.

BACKGROUND OF THE INVENTION

1. Technical Field

This invention relates generally to biasing circuits and, in particular, to constant current biasing circuits.

2. Related Art

A resistor and a diode are commonly used with a bias voltage to create a biasing current for use in numerous types of circuits including amplifiers. As the bias voltage is applied to the resistor diode biasing circuit, a biasing current results. A disadvantage of using a diode in the biasing circuit is that the diode does not create a linear relationship between the bias voltage and the biasing current. Additionally, the dynamic range of the biasing current is limited by a resistor diode biasing circuit.

The diode in the resistor diode biasing circuit also results in biasing current fluctuations when the temperature changes. The biasing current fluctuations have an adverse effect on the circuit being biased and must be tolerated or have additional temperature compensation circuitry added. Thus, there is a need in the art for a biasing circuit that has a linear relationship between the biasing voltage and biasing current and that functions over a broad dynamic range and is unaffected by temperature changes.

SUMMARY

Broadly conceptualized, the invention is a constant current biasing circuit that has a proportional relationship between the biasing voltage and biasing current and that is unaffected by temperature changes. The constant current biasing circuit may be implemented in a complementary metal oxide semiconductor (CMOS) in order to take advantage of the electronic characteristics of CMOS-fabricated circuits.

An example implementation of a constant current biasing circuit is in a linear amplifier. A biasing voltage results in a biasing current that may then be mirrored as a reference current to the power amplifier. The bias circuit also provides feedback around a reference transistor residing on the power amplifier. This feedback loop maintains a quiescent bias for the reference transistor equal to the reference current. The resulting bias voltage from the feedback loop is then used to bias the RF power device. Since the bias point of the amplifier is controlled and does not vary with temperature, the amplifier exhibits reduced variation in linearity over temperature. As a result, the amplifier benefits from increased design margin.

Other systems, methods, features and advantages of the invention will be or will become apparent to one with skill in the art upon examination of the following FIGS. and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION OF THE PREFERRED EMBODIMENTS

Figure 1:
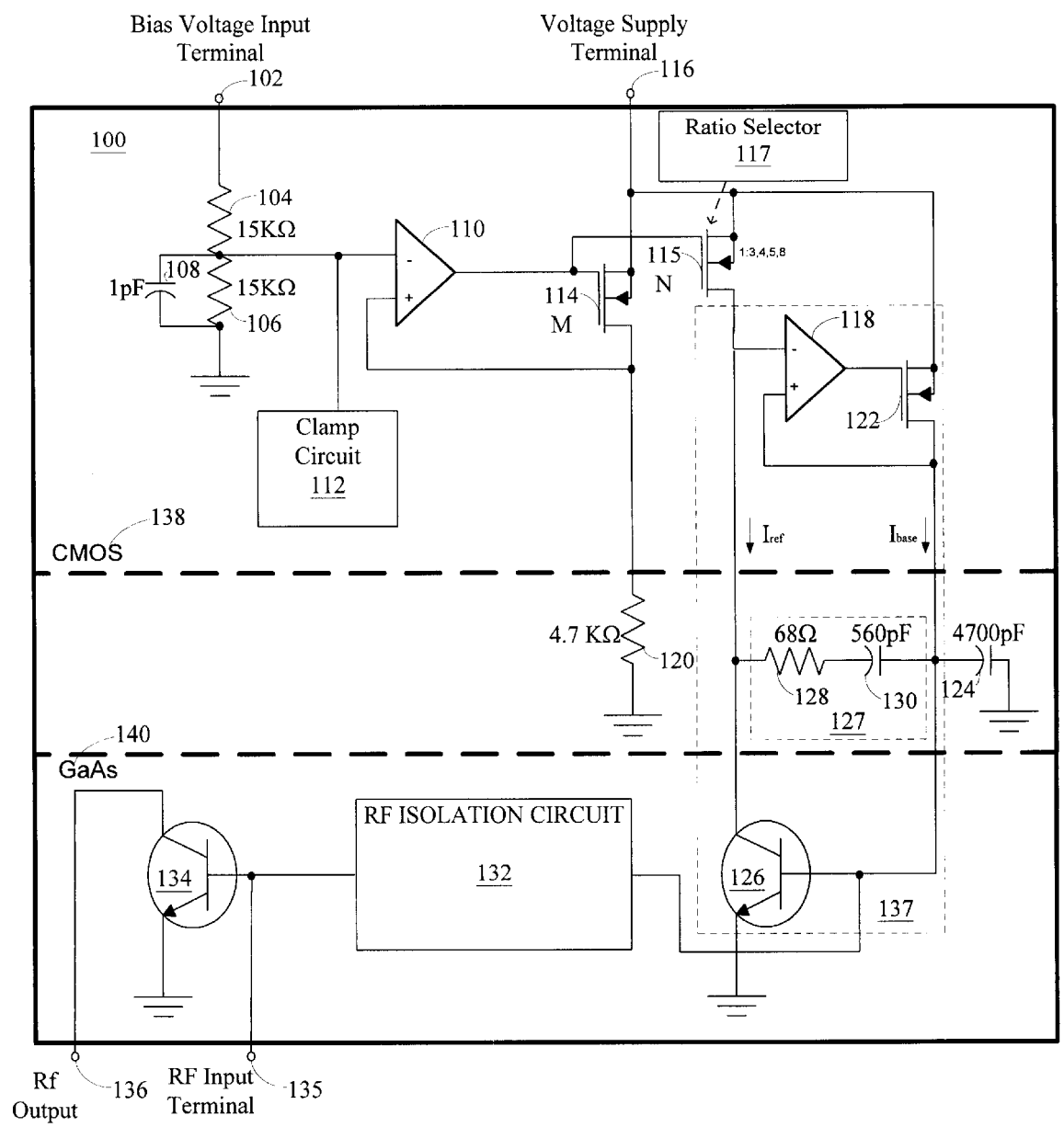
FIG. 1 is an illustration of a circuit diagram of an exemplary implementation of a single-stage amplifier having a constant current bias circuit in accordance with the invention.

In FIG. 1, an illustration of a circuit diagram of an exemplary implementation of a single-stage amplifier 100 having a constant current bias circuit is shown. A bias voltage input terminal 102 is connected to a fifteen kilo-ohm resistor 104. Another fifteen kilo-ohm resistor 106 is connected to the fifteen kilo-ohm resistor 104 and a ground. The two fifteen kilo-ohm resistors 104 and 106 are commonly referred to as a voltage divider resistor pair having an output between the fifteen kilo-ohm resistors 104 and 106. A one pico-farad capacitor 108 is connected as a filter across the resistor 106. The output from the voltage divider resistor pair is also connected to the negative input terminal of op-amp 110 and clamp circuit 112.

The output of the op-amp 110 is connected to the respective gates of a CMOS field effect transistor (FET) 114 and a selectable CMOS FET 115. The CMOS FET 114 has a source that is connected to the voltage supply terminal 116. The CMOS FET 114 has a drain that is connected to the positive input terminal of the op-amp 110 and a 4.7 kilo-ohm resistor 120. The source of the selectable CMOS FET 115 is connected to the voltage supply terminal 116 and the drain of the selectable CMOS FET 115 is connected to the negative input terminal of a operational amplifier 118. The operational amplifier 118 has an output that is connected to the gate of another CMOS FET 122. The source of the other CMOS FET 122 is connected to the voltage supply terminal 116. The drain of the other CMOS FET 122 is connected to the positive input terminal of the operational amplifier 118, a noise filter capacitor 124, the base of a bipolar junction transistor (BJT) 126, an RF isolation circuit 132, and a compensation network 127 having a sixty-eight ohm resistor 128 and a five hundred sixty pico-farad capacitor 130. The compensation network 127 is connected to the negative input terminal of the operational amplifier 118 and the drain of the selectable CMOS FET 115. The compensation network 127 is also connected to the collector of the BJT 126 and an RF isolation circuit 132. Additionally, the BJT 126 has an emitter that is connected to ground. Another BJT 134 has a base that is connected to the RF isolation circuit 132 and the RF input terminal 135, an emitter connected to ground, and a collector connected to the RF output 136.

A bias voltage, for example two volts, is applied to the bias voltage input terminal 102. The fifteen kilo-ohm voltage divider resistor pair. 104 and 106 divide the bias voltage, and the high frequencies that may be present in the bias voltage are filtered by the one pico-farad capacitor 108. The divided voltage is received at the op-amp 110 and activates the CMOS FET 114, allowing the current to flow through the 4.7 kilo-ohm resistor 120. Op-amp 110 forces the voltage at resistor 120 to be equal to the divided bias voltage at the negative input terminal of op-amp 110. The voltage at the 4.7 kilo-ohm resistor 120 divided by the resistance value (4.7 kilo-ohms) is an $I_{bias}$ current. Resistors 104 and 106 are ratioed, so temperature effects cancel. Resistor 120 is an external component having a low temperature co-efficient. Thus, the $I_{bias}$ current has a direct relationship to the bias voltage applied to the bias voltage input terminal while not being affected by changes in temperature.

The $I_{bias}$ current is mirrored with the selectable CMOS FET 115 to produce a current $I_{ref}$. $I_{ref}$ is directly related to $I_{bias}$ by the area ratio (N/M) of CMOS FET 114 and selectable CMOS FET 115. The area ratio N/M is set by a ratio selector 117 that selects the number of CMOS FETs to be connected in parallel (shown as the single selectable CMOS FET 115) and is selectable for ratios of 1:3, 1:4, 1:5, and 1:8. The current $I_{ref}$ is then sourced into the collector of the BJT 126.

The operational amplifier 118, the other CMOS FET 122, the BJT 126, and the compensation network 127 create a feedback loop 137. The feedback loop 137 adjusts the base voltage of the BJT 126 to maintain a collector current equal to $I_{ref}$. The DC component of the BJT 126 base voltage is transferred through the RF isolation circuit 132 to the base of the other BJT 134. The quiescent collector current of the other BJT 134 is directly related to $I_{ref}$ by the area ratio of the other BJT 134 to the BJT 126.

If the bias voltage is below the predetermined level (level required to have a minimum bias current $I_{bias}$), the clamp circuit 112 will activate to maintain a minimum voltage at the negative input terminal of the operational amplifier 110. Thus, $I_{bias}$, $I_{ref}$ and the feedback loop 137 are maintained ensuring proper operation of the amplifier.

The circuit is implemented using two types of integrated circuit (IC) fabrication, where both IC die reside in a single electrical package. The first type of fabrication process, CMOS, is used to create the CMOS 138 part that is composed of resistors 104, 106, op-amps 110 and 118, CMOS FETs 114, 115 and 122, capacitors 108 and the clamp circuit 112. The second type of fabrication process, GaAs HBT, is used to create the Gallium Arsenide 140 part that is composed of BJTs 126 and 134, and the RF isolation circuit 132. Resistors 120 and 128, and capacitors 124 and 130 are discrete components, but in alternative embodiments may be implemented in CMOS 138 or Gallium Arsenide 140.

By combining two types of fabrication processes in the same package, the performance of that part can be enhanced by taking advantage of the electrical characteristics of each fabrication process. For example, CMOS is desirable for implementations of bias circuits, while Gallium Arsenide is desirable for implementations of RF circuits. Other examples of types of fabrication include BiCMOS & Gallium Arsenide, Silicon bipolar & Gallium Arsenide, CMOS & Silicon bipolar, CMOS & SiGe bipolar or on a single technology of Silicon BiCMOS or SiGe BiCMOS. The preferred method using CMOS & Gallium Arsenide dies on the same substrate results in a single integrated package; however, the advantages of the constant current bias circuit can be achieved using all discrete components.

Figure 2:
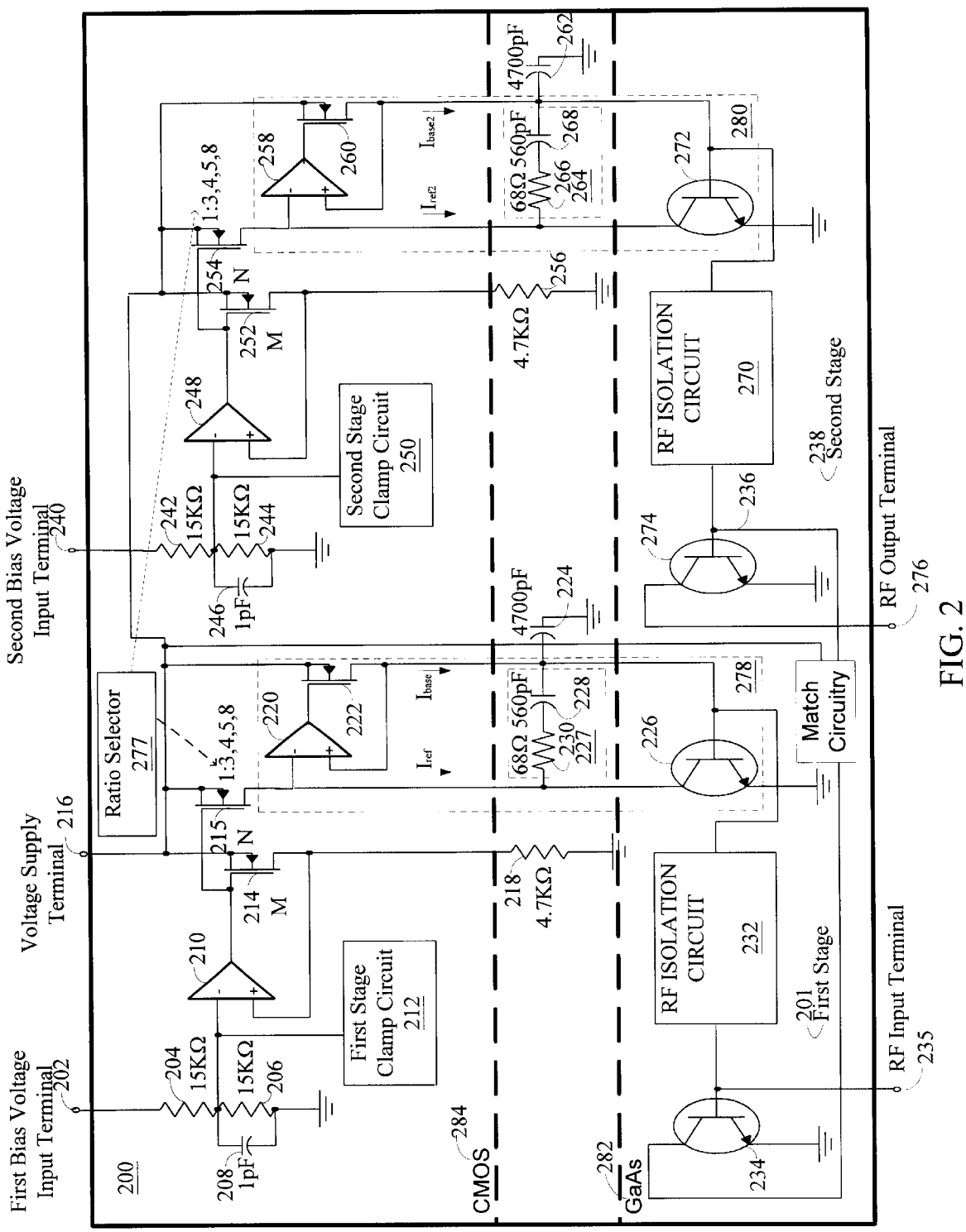
FIG. 2 is an illustration of a circuit diagram of another exemplary implementation of a two-stage amplifier having constant current bias circuits in accordance with the invention.

In FIG. 2, an illustration of a circuit diagram of another exemplary implementation of a two-stage amplifier 200 having constant current bias circuits is shown. The first stage 201 of the two-stage (or multi-stage) amplifier has a bias voltage input terminal 202 that is connected to a fifteen kilo-ohm resistor 204. Another fifteen kilo-ohm resistor 206 is connected to the fifteen kilo-ohm resistor 204 and a ground. The two fifteen kilo-ohm resistors 204 and 206 are commonly referred to as a voltage divider resistor pair having an output between the fifteen kilo-ohm resistors 204 and 206. A one pico-farad capacitor 208 is connected as a filter across the fifteen-ohm resistor 206. The output from the voltage divider resistor pair is also connected to the negative input terminal of op-amp 210 and a first-stage clamp circuit 212.

The output of the op-amp 210 is connected to the respective gates of a CMOS FET 214 and a selectable CMOS FET 215. The CMOS FET 214 has a source that is connected to the voltage supply terminal 216. The CMOS FET 214 has a drain that is connected to the positive input terminal of the op-amp 210 and a 4.7 kilo-ohm resistor 218. The source of the selectable CMOS FET 215 is connected to the voltage supply terminal 216 and the drain of the selectable CMOS FET 215 is connected to the negative input terminal of a operational amplifier 220. The operational amplifier 220 has an output that is connected to the gate of another CMOS FET 222. The source of the other CMOS FET 222 is connected to the voltage supply terminal 216. The drain of the other CMOS FET 222 is connected to the positive input terminal of the operational amplifier 220, a noise filter capacitor 224, the base of a BJT 226, an RF isolation circuit 232, and a compensation network 227 having a five hundred sixty pico. Farad capacitor 228 and a sixty-eight ohm resistor 230. The compensation network 227 is connected to the negative input terminal of the operational amplifier 220 and the drain of the selectable CMOS FET 215. The compensation network 227 is also connected to the collector of the BJT 226 and an RF isolation circuit 232. Additionally, the BJT 226 has an emitter that is connected to ground. Another BJT 234 has a base that is connected to the RF isolation circuit 232 and the RF input terminal 235, an emitter connected to ground, and a second stage RF input 236.

The second stage 238 of the two-stage amplifier 200 has a second bias voltage input terminal 240 connected to a second stage fifteen kilo-ohm resistor 242. Another second stage fifteen kilo-ohm resistor 244 is connected to the second stage fifteen kilo-ohm resistor 242 and ground. The second stage fifteen kilo-ohm resistors 242 and 244 form another voltage divider resistor pair having an output between the resistors 242 and 244. A second stage one pico-Farad capacitor 246 is connected across the other second stage fifteen kilo-ohm resistor 244 and acts as a filter. The output from the second stage voltage divider resistor pair 242 and 244 is connected to the negative input terminal of a second stage op-amp 248 and a second stage clamp circuit 250.

The output of the second stage op-amp 248 is connected to the gates of a second stage CMOS FET 252 and a second stage selectable CMOS FET 254. The second stage CMOS FET 252 has a source that is connected to the voltage supply terminal 216 and a drain connected to the positive input terminal of the second stage op-amp 248. Further, the drain of the second stage CMOS FET 252 is connected to a second stage 4.7 kilo-ohm resistor 256. The source of the second stage selectable CMOS FET 254 is connected to the voltage supply terminal 216. The drain of the second stage selectable CMOS FET 254 is connected to the negative input terminal of a second stage operational amplifier 258. The second stage operational amplifier 258 has an output that is connected to the gate of another second stage CMOS FET 260. The source of the other CMOS FET 260 is connected to the voltage supply terminal 216. The drain of the other CMOS FET 260 is connected to the positive input terminal of the second stage operational amplifier 258, a second stage noise filter capacitor 262, the base of a second stage BJT 272, a second stage RF isolation circuit 270, and a second stage compensation network 264 having a sixty-eight ohm resistor 266 and a five hundred sixty pico-Farad capacitor 268. The second stage compensation network 264 is also connected to the collector of the second stage BJT 272. Additionally, the second stage BJT 272 has an emitter that is connected to ground. Another second stage BJT 274 has a base connected to the RF isolation circuit 270 and the second stage. RF input terminal 236. The emitter of the other second stage BJT 274 is connected to ground while the collector is connected to an RF output terminal 276.

A first stage bias voltage is applied to the first bias voltage input terminal 202. The voltage divider resistor pair 242 and 244, then divides the first bias voltage. High frequencies that may be present in the first bias voltage are filtered by the one pico-farad capacitor 208. The divided voltage is received at the op-amp 210 and activates the CMOS FET 214 allowing the current to flow through the 4.7 kilo-ohm resistor 218. Op-amp 210 forces the voltage at resistor 218 to be equal to the divided bias voltage at the negative input terminal of op-amp 210. The voltage at the 4.7 kilo-ohm resistor 218 divided by the resistance value (4.7 kilo-ohms) is a first stage $I_{bias}$ current. Thus, the first stage $I_{bias}$ current has a direct relationship to the first stage bias voltage.

The first stage $I_{bias}$ current is mirrored with the selectable CMOS FET 222 to produce a first stage reference current $I_{ref}$. $I_{ref}$ is directly related to $I_{bias}$ by the area ratio (N/M) of CMOS FET 214 and selectable CMOS FET 215. The area ratio N/M is set by a ratio selector 277 that selects the number of CMOS FETs to be connected in parallel (shown as the single selectable CMOS FET 215) and is selectable for a ratios of 1:3, 1:4, 1:5, and 1:8. The first stage current $I_{ref}$ is then sourced into the collector of the BJT 226.

The operational amplifier 220, the other CMOS FET 222, the BJT 226, and the compensation network 227 create a feedback loop 278. The feedback loop 278 adjusts the base voltage of the BJT 226 to maintain a collector current equal to $I_{ref}$. The DC component of the BJT 226 base voltage is transferred through the RF isolation circuit 232 to the base of the other BJT 234. The quiescent collector current of the other BJT 234 is directly related to $I_{ref}$ by the area ratio of the other BJT 234 to the BJT 226.

If the first stage bias voltage is below the predetermined level (level required to have a minimum bias current $I_{bias}$), the first stage clamp circuit 212 will activate to maintain a minimum voltage to the negative input terminal of the operational amplifier 210. Thus, $I_{bias}$, $I_{ref}$ and the feedback loop 278 are maintained ensuring proper operation of the amplifier. The RF output from the other BJT 234 of first stage 201 is connected to the second stage RF input terminal 236.

The second stage 238 of a two-stage amplifier has a second bias voltage input terminal 240 for receipt of a second bias voltage. The other fifteen kilo-ohm voltage resistor pair 242 and 244 divide the second bias voltage, and the high frequencies that may be present in the bias voltage are filtered by the second stage one pico-Farad capacitor 246. The divided second bias voltage is received at the second stage op-amp 248 and activates the second stage CMOS FET 252 allowing current to flow through the second stage 4.7 kilo-ohm resistor 256. The second stage op-amp 248 forces the voltage at resistor 256 to be equal to the divided bias voltage at the negative input terminal of op-amp 248. The voltage at the second stage 4.7 kilo-ohm resistor 256 divided by the resistance value is the second stage $I_{bias2}$ current. Thus, the second stage $I_{bias2}$ current has a direct relationship to the second stage bias voltage.

The second stage $I_{bias2}$ current is mirrored with the second stage selectable CMOS FET 254 to produce a second stage reference current $I_{ref2}$. $I_{ref2}$ is directly related to $I_{bias2}$ by the area ratio (N/M) of CMOS FET 252 and selectable CMOS FET 254. The area ratio N/M is set by a ratio selector 277 that selects the number of CMOS FETs to be connected in parallel (shown as the single selectable CMOS FET 254) and is selectable for ratios of 1:3, 1:4, 1:5, and 1:8. The second stage current $I_{ref2}$ is then sourced into the collector of the second stage BJT 272.

The second stage operational amplifier 258, the other second stage CMOS FET 260, the second stage BJT 272, and the compensation network 268 create a feedback loop 280. The feedback loop 280 adjusts the base voltage of the BJT 272 to maintain a collector current equal to $I_{ref2}$. The DC component of the BJT 272 base voltage is transferred through the RF isolation circuit 270 to the base of the other BJT 274. The quiescent collector current of the other BJT 274 is directly related to $I_{ref2}$ by the area ratio of the other BJT 274 to the BJT 272.

If the second stage bias voltage is below the predetermined level (level required to have a minimum bias current $I_{bias}$), the second stage clamp circuit 250 will activate to maintain a minimum voltage to the negative terminal of the operational amplifier 248. Thus, $I_{bias2}$, $I_{ref2}$ and the second stage feedback loop 280 are maintained ensuring proper operation of the amplifier. The RF output from the other BJT 274 is connected to the second stage RF output terminal 276.

Therefore, the linear biasing circuit can be used multiple times within a device. The current embodiment contains two separate bias voltage input terminals 202 and 240. In an alternate embodiment, the two bias inputs may be joined to a single input bias voltage terminal. Additionally, the first bias voltage and the second bias voltage values are known voltage levels and may be derived from an integrated bandgap voltage source, batteries, photoelectric cells, electronic fuel cells, or alternating currents. The preferred method to derive a bias input voltage is with a battery and voltage regulator circuit. The circuit of FIG. 2 may be implemented using discrete components or in an integrated circuit package. The preferred method is an integrated circuit package having a common substrate with both GaAs 282 and CMOS 284 dies.

Figure 3:
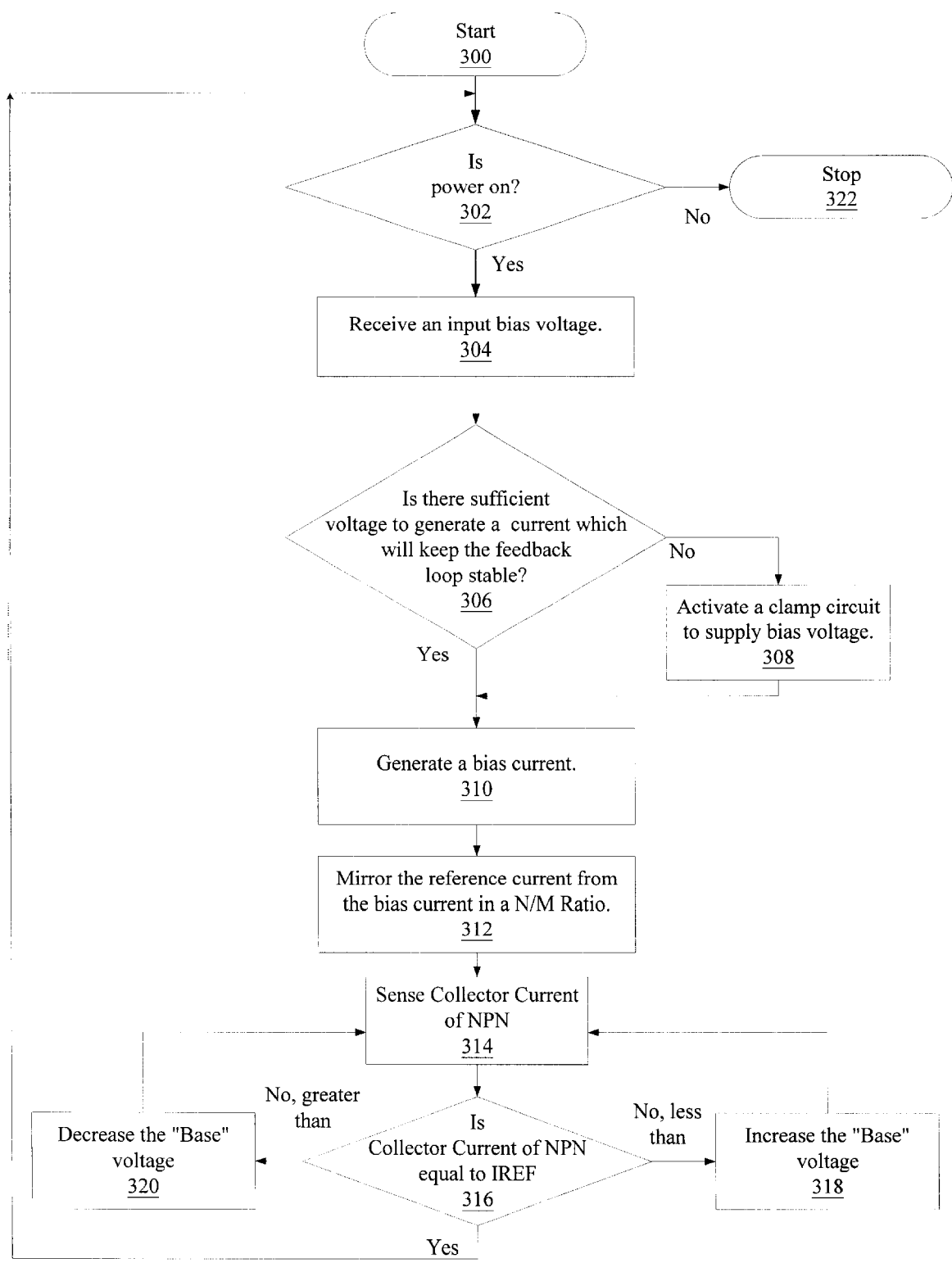
FIG. 3 is a flow diagram illustrating a constant current biasing circuit.

In FIG. 3, a flow diagram illustrating a constant current biasing circuit is shown. The process starts 300 by having the amplifier powered on 302 with a supply voltage at the voltage supply terminal 116, FIG. 1. If the amplifier is powered on 302, then an input bias voltage is received 304 at bias voltage input terminal 102. A determination is made as to the sufficiency of the bias voltage to generate a bias current which will keep the feedback loop 137 stable 306. If the bias voltage is insufficient, then the clamp circuit 112 is activated 308 to supply a sufficient bias voltage. A bias current $I_{ref}$ is generated 310 by the input bias voltage interacting with at least one resistor (such as voltage divider resistor pair 104 and 106). The bias current $I_{ref}$ is mirrored into a base current $I_{base}$ that is related to $I_{ref}$ by the ratio of N/M 312. The collector current of BJT 126 is sensed 314. A check is made to verify if the collector current of BJT 126 is equal to $I_{ref}$ 316. If the collector current of BJT 126 is less than $I_{ref}$, then the base voltage is increased 318. If the collector current of BJT 126 is greater than $I_{ref}$, then the base voltage is decreased 320. The process is continuous while there is power 302. When power is no longer available, the process stops 322. While various embodiments of the invention have been described, it will be apparent to those of ordinary skill in the art that many more embodiments and implementations are possible that are within the scope of this invention.

What is claimed is:

1. A constant current bias circuit, comprising:

an at least one resistor;

a bias voltage input terminal for receipt of a bias voltage that is divided by two resistances ratioed to cancel temperature variances connected to the at least one resistor by an electrical path resulting in a bias current when the bias voltage is present; and a clamp circuit coupled by an electrical path to the at least one resistor that provides a minimum bias current.

2. The constant current bias circuit of claim 1, wherein the bias current is in a linear relationship with the bias voltage.

3. The constant current bias circuit of claim 1, further comprising:

a circuit having a plurality of components electrically coupled to the at least one resistor in receipt of the bias current.

4. The constant current bias circuit of claim 3, wherein the at least one resistor is in a first material in a substrate and at least one component of tile plurality of components is a second material is in the substrate and different from the first material.

5. The constant current bias circuit of claim 4, wherein the first material is Complementary Metal Oxide Semiconductor fabrication material.

6. The constant current bias circuit of claim 5, wherein the second material is Gallium Arsenide Semiconductor fabrication material.

7. The constant current bias circuit of claim 3, wherein the circuit is a single stage amplifier.

8. The constant current bias circuit of claim 3, wherein the circuit is a multi-stage amplifier.

9. The constant current bias circuit of claim 9, further comprising a feedback loop that maintains a quiescent bias for a transistor equal to a reference current, wherein the reference current is mirrored from the bias current.

10. A constant current bias circuit, comprising:

an at least one resistor;

means for receiving a bias voltage that is divided by two resistances ratioed to cancel temperature variances connected to the at least one resistor by all electrical path resulting in a bias current when the bias voltage is present; and means for providing a minimum bias current coupled by an electrical path to the at least one resistor.

11. The constant current bias circuit of claim 10, wherein the bias current is in a linear relationship with the bias voltage.

12. The constant current bias circuit of claim 10, further comprising:

a circuit having a plurality of components electrically coupled to the at least one resistor in receipt of the bias current.

13. The constant current bias circuit of claim 12, wherein the at least one resistor is in a first material in a substrate and at least one component of the plurality of components is a second material is in the substrate and different from the first material.

14. The constant current bias circuit of claim 13, wherein the first material is Complementary Metal Oxide Semiconductor fabrication material.

15. The constant current bias circuit of claim 14, wherein the second material is Gallium Arsenide Semiconductor fabrication material.

16. The constant current bias circuit of claim 12, wherein the circuit is a single stage amplifier.

17. The constant current bias circuit of claim 12, wherein the circuit is a multi-stage amplifier.

18. The constant current bias circuit of claim 10, further comprising a means for generating a feedback loop to maintain a quiescent bias for a transistor equal to a reference current wherein the reference current is mirrored from the bias current.

19. A method for constant current biasing, comprising:

receiving an input bias voltage that is divided by two resistances ratioed to cancel temperature variances;

generating a bias current by at least one resistor being in receipt of the input bias voltage; and determining if the bias current is above a predetermined threshold.

20. The method of claim 19, further comprising:

activating a clamp circuit to assure the bias current is above a predetermined threshold.

21. The method of claim 19, further comprising:

mirroring the bias current Iref to a base current Ibase by a predetermined ration.

22. The method of claim 19, further comprising:

receiving the bias current at a transistor in a first material different, wherein the bias current was generated in a second material.

23. The method of claim 22, wherein the second material is CMOS and shares a substrate with the second material.

24. The method of claim 19, further comprising: maintaining a feedback loop of a quiescent bias for a transistor equal to a reference current, wherein the reference current is mirrored from the bias current.

* * * * *